(12) United States Patent
Srinivasa et al.

(10) Patent No.: US 8,117,141 B1
(45) Date of Patent: Feb. 14, 2012

(54) HIERARCHICAL SYSTEM FOR MULTI-OBJECTIVE SHAPE CONTROL OF VARIABLE STIFFNESS STRUCTURES

(75) Inventors: Narayan Srinivasa, Oak Park, CA (US); David Shu, West Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 674 days.

(21) Appl. No.: 12/316,276

(22) Filed: Dec. 10, 2008

Related U.S. Application Data

(63) Continuation-in-part of application No. 11/999,427, filed on Dec. 4, 2007.

(51) Int. Cl.
*G06N 5/00* (2006.01)
(52) U.S. Cl. .......................... 706/14; 706/45
(58) Field of Classification Search ............... 706/14, 706/45
See application file for complete search history.

(56) References Cited

U.S. PATENT DOCUMENTS 7,550,189 B1    6/2009   McKnight et al.

OTHER PUBLICATIONS

Tung, et al., "Using Finite State Automata to Produce Self-Optimization and Self-Control," IEEE Transactions in Parallel and Distributed Systems, vol. 7, No. 4, pp. 439-448, 1996.*

Joo, Jinyong, and Kota, Sridhar (2004), "topological Synthesis of Compliant Mechanisms Using Nonlinear Beam Elements," Mechanics Based Design of Structures and machines, 32: 1, 17-38.

Frecker, M.I., G.K. Ananthasuresh, N. Nishiwaki, N. Kikuchi and S. Kota, "Topological synthesis of compliant mechanisms using multicriteria optimization," ASME J. Mech. Design, 119: 238-245, 1997.

M.L. Tsetlin, "Finite automata and models of simple forms of behavior," PhD Thesis, V.A. Steklov Mathematical Institute, 1964.

Hetrick, J., et al., An energy formulation for parametric size and shape optimization of compliant mechanisms, ASME Journal of Mechanical Design, vol. 121, pp. 229-234, 1999.

Ananthasuresh, G.K., et al, "Strategies for systematic synthesis of compliant MEMS," ASME Winter Annual Meeting, vol. 55, pp. 677-686, 1994.

Lu, K., et al., "Design of compliant mechanisms for morphing structural shapes," Journal of Intelligent Material Systems and Structures, vol. 14, pp. 279-391, Jun. 2003.

(Continued)

*Primary Examiner* — Wilbert L Starks
(74) *Attorney, Agent, or Firm* — Tope-McKay & Assoc.

(57) ABSTRACT

The present invention relates to a hierarchical system for multi-objective shape control of variable stiffness structures. The system operates by initializing a hierarchical hybrid Gur-game controller that is affixed to a variable stiffness structure. The hierarchical hybrid Gur-game controller includes a hierarchy of Gur-games being utilized, at each level of the hierarchy, to control at least two angular rotations and at least one stiffness setting of the variable stiffness structure. The Gur-game controller is utilized to optimize variables, including angular rotations and stiffness settings of the variable stiffness structure to morph into a desired shape. Finally, the variable stiffness structure is morphed into the desired shape according to the optimized angular rotation and stiffness settings.

36 Claims, 11 Drawing Sheets

OTHER PUBLICATIONS

Goldberg, D., "Genetic Algorithms," in Search, Optimization, and Machine Learning, pp. 1-57, Addison Wesley, 1989.

Austin, F., et al., "Comparison of smart wing concepts for transonic cruise drag reduction," SPIE Proceedings, vol. 3044, pp. 33-40, 1997.

York, A.R., et al., "The material point method for simulation of thin membranes," Int. J. Numer. Meth. Eng., 44, 1429-1456, 1999.

More, J., et al., Documentation file accessible at http://www.netlib.org/minpack/readme.

B. Tung, et al., "Using finite state automata to produce self-optimization and self-control," IEEE Transactions in Parallel and Distributed Systems, vol. 7, No. 4, pp. 439-448, 1996.

* cited by examiner

HIERARCHICAL SYSTEM FOR MULTI-OBJECTIVE SHAPE CONTROL OF VARIABLE STIFFNESS STRUCTURES

PRIORITY CLAIM

The present application is a Continuation-in-Part application, claiming the benefit of priority of U.S. application Ser. No. 11/999,427, filed on Dec. 4, 2007, entitled, "Method for the design and optimization of morphing strategies for reconfigurable surfaces."

FIELD OF INVENTION

The present invention generally relates to variable stiffness structures and, more particularly, to a system for multi-objective shape control of the variable stiffness structures.

BACKGROUND OF INVENTION

The performance of many mechanical-structural systems, such as aircraft wings and antenna reflectors, is directly related to the geometric shapes of their components. Such systems would ideally like to adopt different shapes for different operating conditions, but they are generally designed to have one fixed shape that constitutes a compromise with respect to all the operating conditions. Reconfigurable surfaces offer ways to dynamically reconfigure the shape of the material surface under varying operating conditions and external disturbances. This capability will enable systems, such as aircrafts, to maintain enhanced performance and versatility. The most common approach to morph structures is based on compliant mechanisms (see Literature Reference No. 1). A compliant mechanism is a single piece of flexible structure that delivers the desired motion by undergoing elastic deformation as opposed to the rigid body motions in a conventional mechanism. These mechanisms are flexible enough to transmit motions, yet stiff enough to withstand external loads. The hingeless nature of compliant mechanism eliminates the backlash error and effectively reduces the production and maintenance costs associated with systems. Moreover, the distributed compliance throughout the compliant mechanism provides a smooth deformation field, which reduces the stress concentration. Previous research on compliant mechanism synthesis has typically employed a two-step synthesis approach (see Literature Reference No. 2). The two-step approach decomposes the interrelated topology and dimensional syntheses into two separate stages: (1) topology synthesis ensures the motion in the desired output direction and (2) the size and geometry optimization refines the mechanism dimensions to achieve a desired objective such as maximizing displacement. There are successful demonstrations of morphing structures based on the idea of compliant mechanisms (see Literature Reference Nos. 3 through 5).

Most of these efforts are however limited in several ways. First, they are not well suited for large deformation morphing tasks (see Literature Reference No. 6). This is because the amount of elastic energy consumed in morphing with large deformation using these compliant mechanisms is prohibitively large and makes it impractical to implement on real systems. In addition, these mechanisms cannot accomplish significant "Gaussian Curvature" or simultaneous curvature about two orthogonal axes because this requires a change in area in the plane of the deformation. The assumptions made in the design of the morphing strategies based on compliant mechanisms are way too simplified as well. Some of these assumptions include (see Literature Reference No. 5) the requirement that the shape changing object will change from its initial profile to only one target profile and that the compliant mechanism has only a single external input actuator at a specified location. These assumptions are far too restrictive for any general purpose morphing task.

One promising approach for creating large deformation morphing structures is based on using variable stiffness components to provide large deformation without large energy input to the system. Such a system is described in Literature Reference No. 6. A variable stiffness structure consists of constant stiffness material layers and variable modulus material layers arranged in alternating layers. The variable modulus material layers have a material with a changeable elastic modulus in response to an applied energy field so as to allow reversible coupling and decoupling of stress transfer between successive layers of the constant stiffness material layers to provide a change in a bending stiffness of the variable stiffness structure. In a previous invention (see Literature Reference No. 11), distributed genetic algorithms (GA) was applied to design shape morphing strategies for reconfigurable surfaces composed of variable stiffness components. However, Genetic algorithm (GA) is a one shot solution and does not account for the dynamics of the control task. In particular, a one shot solution may possibly violate the strain constraints for morphing structural shapes. Deforming structures composed of variable stiffness components is an ill-posed problem because there can be multiple dynamic control solutions for any given morphing task.

Thus, a continuing need exists for a multi-object control system for variable stiffness structures. The present invention solves this problem by operating on incremental steps which conform to the strain constraints while following the control task's dynamics.

SUMMARY OF INVENTION

The present invention relates to a hierarchical system for multi-objective shape control of variable stiffness components. The present invention provides a tool for the design of morphing strategies for reconfigurable surfaces consisting of variable stiffness components. Variable stiffness components create an ill-posed design problem and generally have multiple solutions for any given morphing task.

This present invention includes as an optimization search using a modified Gur-game to efficiently search the design space and rapidly arrive at a family of plausible solutions. The present invention offers a completely new method to derive complex target shapes using reconfigurable shapes composed of variable stiffness materials in a totally "unconstrained" fashion based on the modified Gur-game. The strain constraints are conformed with rapid convergence to morphing strategies to achieve target shapes. Furthermore, the present invention easily allows a user to rapidly change the target shapes during the design process and, thus, can be useful for "real-time" requirements where the shapes that the user needs may change during operation.

The present invention is directed to a method for multi-objective shape control of a variable stiffness structure. The method includes several acts, such as initializing a hierarchical hybrid Gur-game controller that is connected to a variable stiffness structure. The hierarchical hybrid Gur-game controller includes a hierarchy of Gur-games being utilized. At each level of the hierarchy, the Gur-game controller is configured to control a set of actuation (e.g., at least two angular rotations) and stiffness change control actions (e.g., at least one stiffness setting) of the variable stiffness structure. The Gur-game controller is used to optimize an objective function that is computed by actions of a plurality of players to morph the variable stiffness structure into a desired shape. Each player is a variable that can be optimized using the Gur-game. Finally, the variable stiffness structure is morphed into the desired shape according to the optimized variables (e.g., angular rotations and stiffness settings).

In another aspect, the present invention includes an act of configuring the Gur-game controller to include a Gur-game with a multi-arm structure to model players with analog control outputs. The Gur-game controller also includes a Gur-game that comprises a pool of players of both binary and analog control outputs.

In another aspect, the Gur-game controller is configured to operate as a time-based multi-objective optimizer such that duration is weighted for each variable to search for an optimized duration to apply each variable.

In yet another aspect, the Gur-game controller is configured to prevent the Gur-game from being stuck in a local minima by causing each player to reset and restart the Gur-game.

Additionally, the Gur-game controller includes control error and further comprising an act of configuring the Gur-game controller to include a reward function that decreases as the control error decreases.

In another aspect, the objective function is toggled between Euclidean distance and curvature accuracy.

In yet another aspect, the present invention also includes a system and computer program product for multi-objective shape control of a variable stiffness structure. The system comprises one or more processors configured to perform the operations described herein. Finally, the computer program product comprises computer-readable instruction means stored on a computer-readable medium that are executable by a computer for causing the computer to perform the operations.

BRIEF DESCRIPTION OF THE DRAWINGS

The objects, features and advantages of the present invention will be apparent from the following detailed descriptions of the various aspects of the invention in conjunction with reference to the following drawings, where.

DETAILED DESCRIPTION

Figure 1:
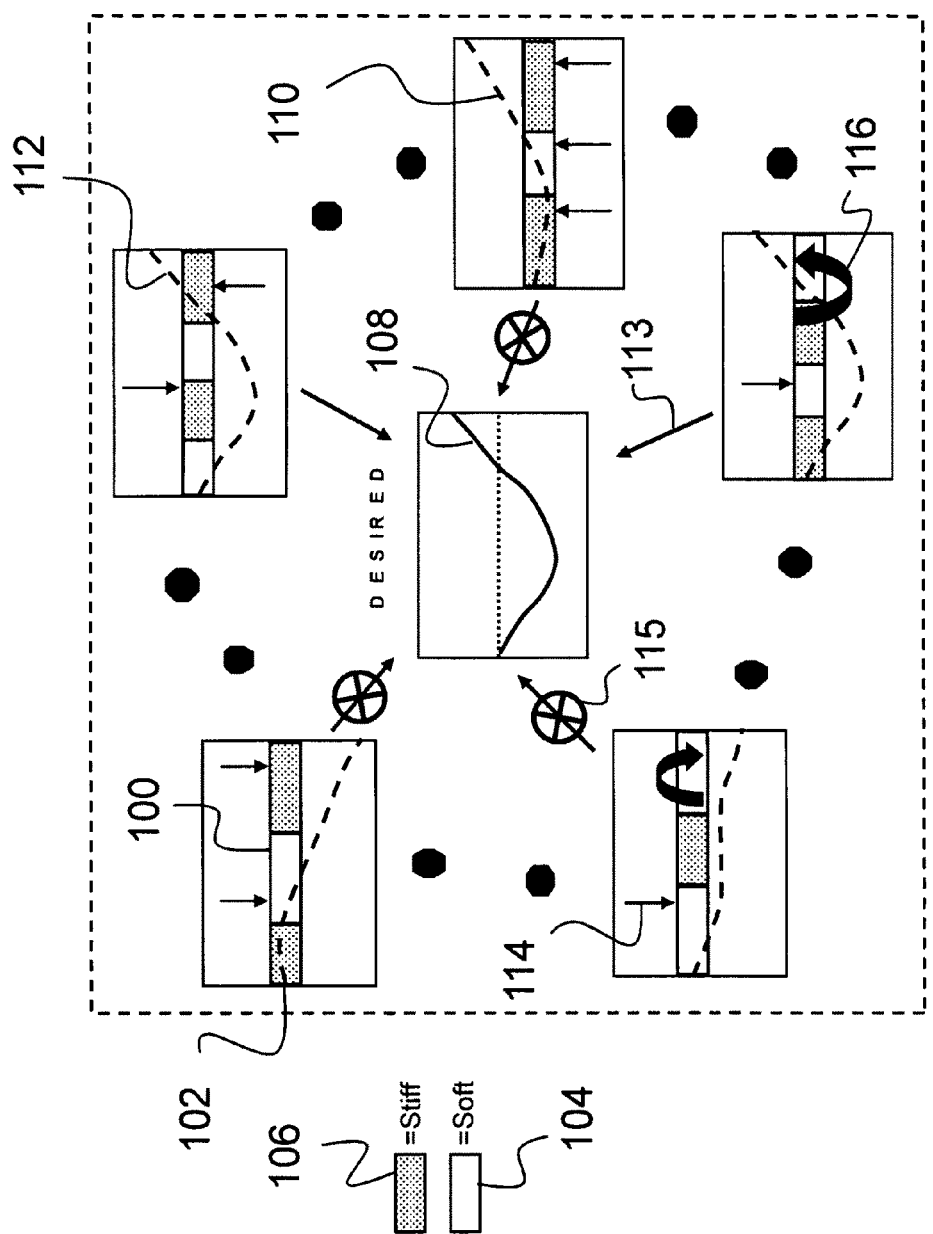
FIG. 1 is an illustration providing an example of a design space for a cantilever beam (fixed at the left end) with variable stiffness components.

The present invention generally relates to a variable stiffness structures and, more particularly, to a system for multi-objective shape control of the variable stiffness structures. The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Before describing the invention in detail, first a list of cited references is provided. Next, a glossary of terms that are used in the description and claims is presented. Following the glossary, a description of various principal aspects of the present invention is provided. Subsequently, an introduction provides the reader with a general understanding of the present invention. Finally, details of the present invention are provided to give an understanding of the specific aspects.

(1) LIST OF CITED LITERATURE REFERENCES

The following references are cited throughout this application. For clarity and convenience, the references are listed herein as a central resource for the reader. The following references are hereby incorporated by reference as though fully included herein. The references are cited in the application by referring to the corresponding literature reference number.

1. Hetrick, J., and Kota, S., "An Energy Formulation for Parametric Size and Shape Optimization of Compliant Mechanisms," *ASME Journal of Mechanical Design*, vol. 121, pp. 229-234, 1999.

2. Joo, J., "Nonlinear Synthesis of Compliant Mechanisms: Topology and Size and Shape Design", *Ph. D. Dissertation*, University of Michigan, Ann Arbor, 2001.
3. Ananthasuresh, G. K., Kota, S and Kikuchi, K, "Strategies for Systematic Synthesis of Compliant MEMS," *ASME Winter Annual Meeting*, vol. 55, pp. 677-686, 1994.
4. Frecker, M., "Optimal Design of Compliant Mechanisms," *Ph. D. Dissertation*, University of Michigan, Ann Arbor, 1997.
5. Lu, K, and Kota, S., "Design of Compliant Mechanisms for Morphing Structural Shapes," *Journal of Intelligent Material Systems and Structures*, vol. 14, pp. 379-391, June 2003.
6. U.S. patent application Ser. No. 11/193,148, filed on Jul. 29, 2005, and entitled, "Variable Stiffness Materials."
7. Goldberg, D., *Genetic Algorithms in Search, Optimization, and Machine Learning*, pp. 1-57, Addison Wesley, 1989.
8. Austin, F., Siclari, M. J., Van Nostrand, W., Weisensel, G. N., Kottamusu, V., and Volpe, G., "Comparison of Smart Wing Concepts for Transonic Cruise Drag Reduction," *SPIE Proceedings*, vol. 3044, pp. 33-40, 1997.
9. York, A. R., Sulsky, D., and Schreyer, H. L., "The Material Point Method for Simulation of Thin Membranes", *Int. J. Numer. Meth. Eng,* 44, 1429-1456, 1999.
10. Moré, J., Garbow, B., and Hillstrom, K., MINPACK: Documentation file accessible at: http://www.netlib.org/minpack/readme.
11. U.S. patent application Ser. No. 11/999/427, filed on Dec. 4, 2007, entitled, "Method for the Design and Optimization of Morphing Strategies for Reconfigurable Surfaces.
12. B. Tung and L. Kleinrock, "Using Finite State Automata to Produce Self-Optimization and Self-Control," *IEEE Transactions in Parallel and Distributed Systems*, Vol. 7, No. 4, pp. 439-448, 1996.
13. M L Tsetlin, "Finite Automata and Modeling the Simplest Forms of Behavior," PhD Thesis, V. A. Steklov Math. Instl, 1964.

(2) GLOSSARY

Before describing the specific details of the present invention, a glossary is provided in which various terms used herein and in the claims are defined. The glossary provided is intended to provide the reader with a general understanding of the intended meaning of the terms, but is not intended to convey the entire scope of each term. Rather, the glossary is intended to supplement the rest of the specification in more accurately explaining the terms used.

Gur-game—The term "Gur-game" is a finite state automata in the form of a game played between different players to jointly optimize their common goal.

Gur-game Controller—The term "Gur-game controller" refers to a distributed controller design based on the Gur game.

Instruction Means—The term "instruction means" as used with respect to this invention generally indicates a set of operations to be performed on a computer, and may represent pieces of a whole program or individual, separable, software modules. Non-limiting examples of "instruction means" include computer program code (source or object code) and "hard-coded" electronics (i.e. computer operations coded into a computer chip). The "instruction means" may be stored in the memory of a computer or on a computer-readable medium such as a floppy disk, a CD-ROM, and a flash drive.

Player—The term "player" generally refers to each variable that needs to be optimized using the Gur game.

(3) PRINCIPAL ASPECTS

The present invention has three "principal" aspects. The first is a hierarchical system for multi-objective shape control of variable stiffness structures. The system is typically in the form of a computer system operating software or in the form of a "hard-coded" instruction set. This system may be incorporated into a wide variety of devices that provide different functionalities. The second principal aspect is a method, typically in the form of software, operated using a data processing system (computer). The third principal aspect is a computer program product. The computer program product generally represents computer-readable instructions stored on a computer-readable medium such as an optical storage device, e.g., a compact disc (CD) or digital versatile disc (DVD), or a magnetic storage device such as a floppy disk or magnetic tape. Other, non-limiting examples of computer-readable media include hard disks, read-only memory (ROM), and flash-type memories. These aspects will be described in more detail below.

(4) INTRODUCTION

The present invention provides a method for the design of morphing strategies for reconfigurable surfaces consisting of variable stiffness components. Variable stiffness components create an ill-posed design problem and generally have multiple solutions for any given morphing task. The present invention solves this problem through optimization search using a modified Gur-game to efficiently search the design space and rapidly arrive at a family of plausible solutions.

Unlike previous approaches, the present invention not only provides the capability to automatically design morphing strategies but also accounts for the dynamics of the control task for a reconfigurable surface composed of variable stiffness material. The approach allows for designing complex shapes with a wide range of choices in the stiffness of the composed elements, the type and location of actuators used, the range of forces applied and the nature of boundary and loading conditions. The applications of the present invention are numerous, from aircraft wing design, antenna reflector design, flexible mirror design for solar panels in satellites to steerable head lights for automobiles, etc.

A goal of the present invention is to devise a method that can assist in finding the topology and dimensions for the variable stiffness material, so that the deformed curve/shape profile, due to input actuation, matches the target curve/shape with minimum error. There are inherent constraints to be addressed when considering the task of morphing a variable stiffness material into a target shape. Such design constraints include the number of soft and stiff elements in the material, the number of actuators available, the type of forces (e.g., bending, stretching) and their locations, the magnitude of these forces that can applied and other boundary conditions (such as cantilever, etc.). Given these constraints, the present invention can transform an initial configuration of an object (e.g., beam or plate) into a final configuration consisting of variable stiffness components by controlling both stiffness of these components and actuators such that the morphing task can be achieved.

In the present invention, a multi-level Gur-game approach is presented to design shape morphing strategies for reconfigurable surfaces. The problem of control dynamics is addressed by formulating this strategy as a distributed optimization search using a collection of control agents (or players in a Gur-game) which can cooperate on a task easily controlled centrally (that is, from a referee of global sensor feedback). In other words, it is desirable to develop a mechanism capable of producing cooperation in the control agents, with only a simple outside command such as reward or penalty. In the present invention, such a mechanism is developed using a finite state automaton (i.e., finite state machine (FSM)) associated with each control agent. These automata independently "guide" the control agents, while taking into account feedback that captures the composite effect of all the control agents' actions. The present approach can simultaneously satisfy a broad range of design constraints, including structural properties, mechanical loading, boundary conditions, control dynamics, strain and shape.

In order to optimize the multi-objective shape control, a user must first define the final desired properties of the surface having variable stiffness properties. An example of this procedure is illustrated in FIG. 1. FIG. 1 illustrates a design space for a surface 100 (i.e., cantilever beam) that is fixed at its left edge 102. As shown, the surface 100 includes variable properties (i.e., variable stiffness), such as soft 104 and stiff 106 elements. The target curve 108 is illustrated as the desired curve (having the final desired properties). The possible beam configurations are illustrated as dashed lines, where some of them result in incorrect shapes 110 while others are correct shapes 112. The correct shapes 112 are shapes closer to the target curve 108. The straight arrows 114 represent the bending forces while the circular arrows 116 represent moments. Some of the changes result in viable options 113, while others result in unviable options 115.

Figure 2:
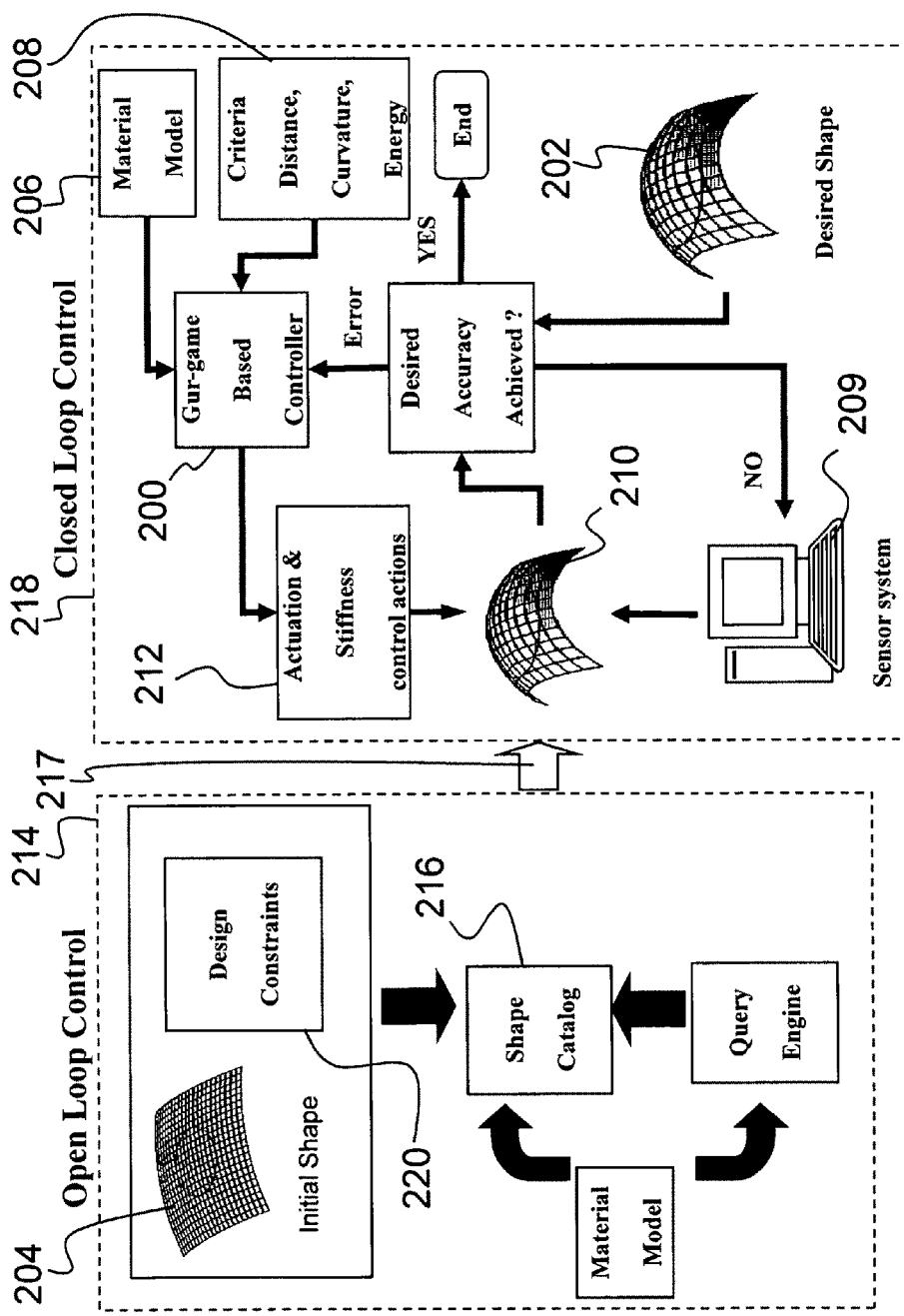
FIG. 2 is flowchart depicted a two stage, integrated control scheme according to the present invention.

A two stage integrated Control Scheme is shown in FIG. 2. Computer simulation of the reconfigurable surface was performed using an accurate physics based model of the variable stiffness surface. The results of the simulations show that the present invention not only verifies the feasibility of morphing tasks of variable stiffness surfaces, but also enables the efficient exploration of much larger design spaces resulting in unique and non-obvious morphing strategies.

FIG. 2 illustrates the control flow diagram pertaining to the controller design based on the Gur-game based controller 200. Given a desired shape 202 and an initial shape 204 of the structure to be morphed, the Gur-game is provided all the variables that are to be optimized, such as the material model parameters 206 (e.g., stiffness) and other constraint variables 208 (e.g., curvature, energy and distance). The Gur-game controller uses the feedback (from a sensor system 209) about the current shape 210 of the material to produce a set of actuation (i.e., moments and forces) and stiffness change control actions 212 to be applied to the current shape 210 in order to drive the material to the desired shape 202.

FIG. 2 also depicts an open loop 214 configuration, which is used to recover a shape from a shape catalog 216 that best matches the desired shape 202. While the use of an open loop 214 is an optional aspect, its use does not guarantee an exact match within the user specified tolerance. As such, there may be circumstances where there is no shape in the shape catalog 216 that matches the desired shape 202. The closed loop controller 218 uses the initial shape 204 from the open loop controller 214 as a starting point. Alternatively, without the open loop controller 214, the initial shape 204 and its design constraints 220 can be plugged 217 directly into the closed loop controller 218.

For clarity, the present invention will be described as follows: Section 5.1 presents a general description of the Gur-game paradigm; Section 5.2 describes a multi-level Gur-game approach; and the final section, Section 5.3, describes the simulation results of two cases for shape morphing using the Gur-game controller for both with and without strain constraints.

(5) DETAILS OF THE INVENTION (5.1) The Gur-Game

Figure 3:
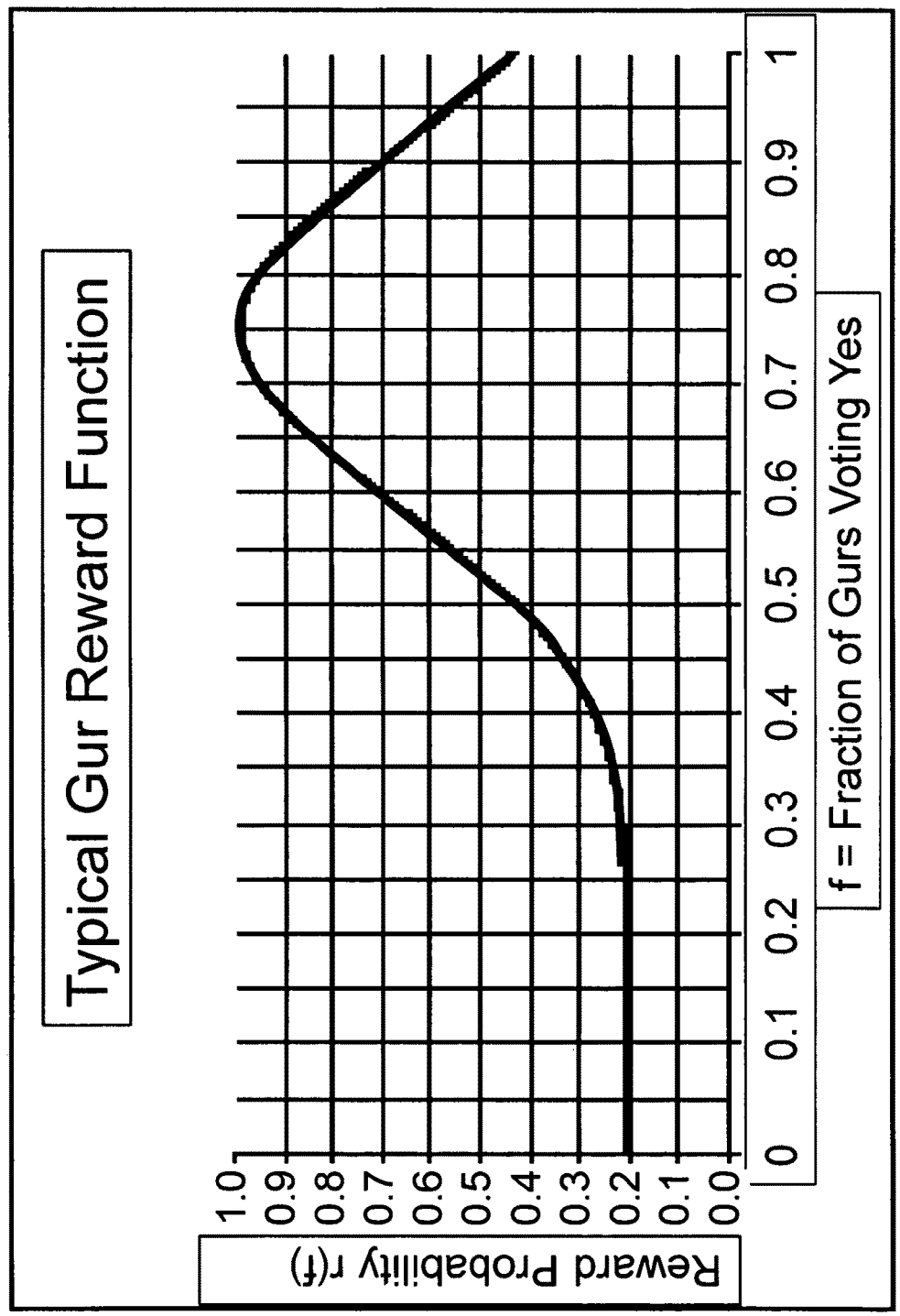
FIG. 3 is chart illustrating a typical Gur Reward function.

A process according to the present invention, which is described in the next section, uses a multi-level Gur-game. To understand the basic Gur-game, imagine that there are many players, none of whom are aware of the others, and a referee. Every second, the referee asks each player to vote yes or no, then counts up the yes and no answers. A reward probability $r=r(f)$ is generated as a function of the fraction f of players who voted yes. It is assumed that $0 \leq r(f) \leq 1$. A typical function is shown in FIG. 3. FIG. 3 illustrates a typical reward function where the abscissa corresponds to the fraction of the players that are voting a "yes" on each trial while the ordinate axis provides the corresponding reward probability r(f) for these votes.

Each player, regardless of how he or she voted, is then independently rewarded (with probability r) or penalized (with probability 1−r). For instance, assume that at some point the number of players voting yes was f1. The reward probability would be r(f1). Each player is then rewarded with probability r(f1). Note that the maximum of the example occurs at f*=0.75. Thus, the following can be shown: No matter how many players there are, they can be "constructed" in such a way that approximately f* of them (in this case, 0.75) vote yes after enough trials. This "Gur-game" property holds for almost any kind of function—whether or not it is discontinuous, multimodal, etc (see Literature Reference No. 12). Note further that the individual automata know neither the fraction f nor the reward function r(f).

Moreover, each player plays solely in a greedy fashion, each time voting the way that seems to give the player the best payoff. This is somewhat unexpected. Greed affects outcomes in an unpredictable manner. An example of greed leading to significantly sub-optimal outcomes is the famous prisoner's dilemma. In the prisoner's dilemma, two entities (the prisoners) greedily optimize their own behavior, but together they produce a globally sub-optimal result. This effect is common in greedy solutions. However, it will be apparent that the method used here does not have this property because the players do not attempt to predict the behavior of the other players. Instead, each player performs by trial and error and preferentially repeats those actions that produce the best result for that player.

Each player i is associated with a finite state automaton $M_i$. The finite state automaton represents the player's memory. It is a single (nearest-neighbor) chain of consecutive states where the total size of the memory is 2N, for some arbitrary N (which is referred to as the size of the automaton). Starting with the leftmost state 400, the states are numbered from −N to −1, then from 1 to N (see FIG. 4). Note that this partitions the chain into a left half 402 (with negative numbered states) and a right half 404 (with positive numbered states). The player is allowed to be in only one state at any given time. Transitions 406 exist only between nearest neighbor states j and j+1 and j−1 (i.e., the player can transition only to adjacent states). If j happens to be N, then the transitions allowed are only to state N−1 and N (i.e., a self-loop). An analogous case exists when j happens to be −N.

(5.2) Multi-Level Gur-Game Controller

The present invention describes a multi-level Gur-game approach that can handle nonlinear variations of the state space and that is easily scalable to large state spaces. Assume N+2 players (2 actuators and N zone heaters), that each player does not communicate with each other, and that there is one referee that consists of global sensor feedback. Each player takes a control action depending upon its current state and the referee. In each round of control action, the referee performs the following actions:

a. Measures the error k in the objective function;
   b. Determines reward probability p(k) based on k; and
   c. Sends p(k) to all players (see Literature Reference No. 12).

Figure 4:
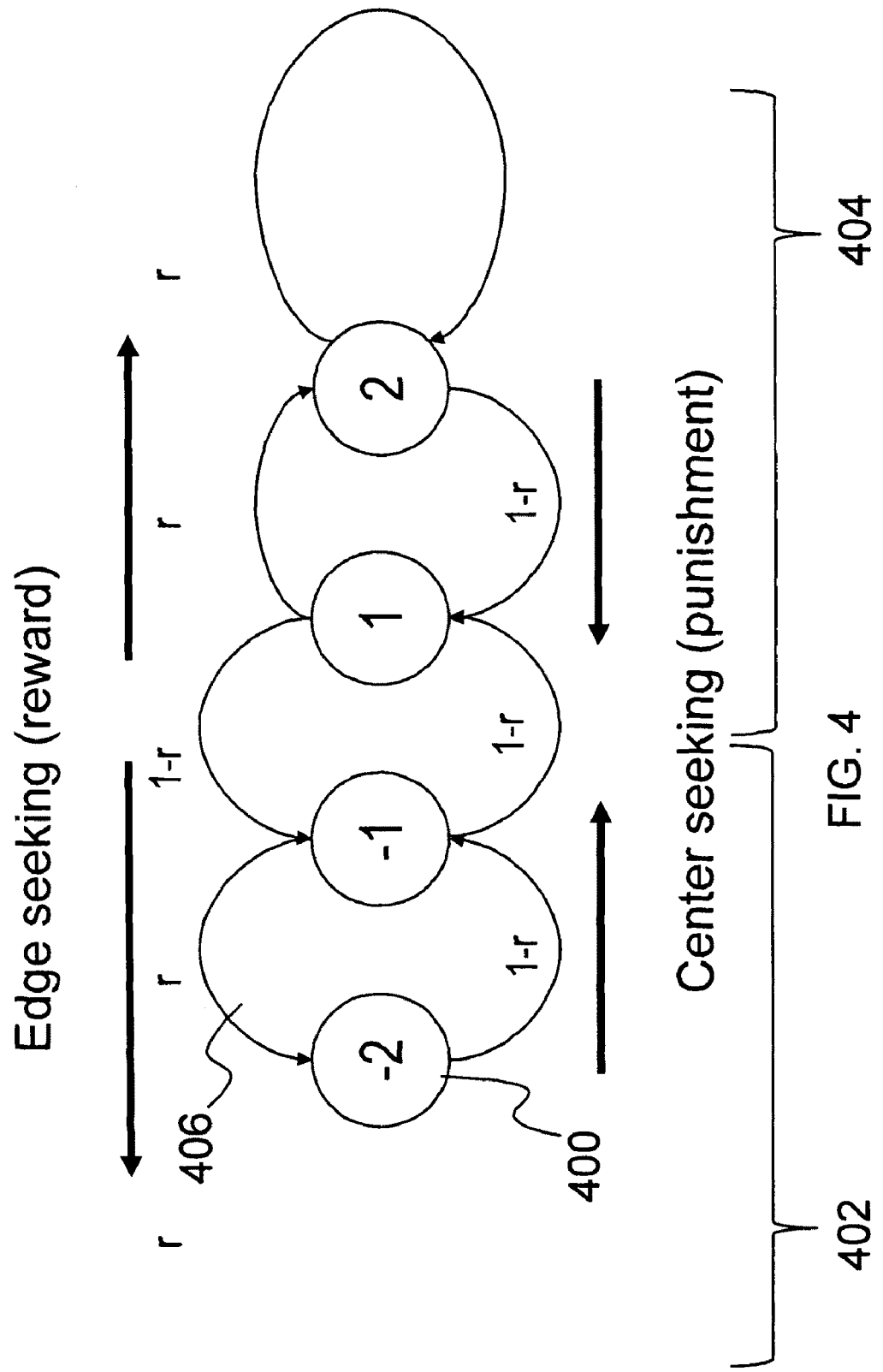
FIG. 4 is an illustration depicting a Gur Memory of size N=2.

The present invention improves upon the prior art by providing a multi-objective version of the Gur-game (as a non-limiting example and for illustrated purposes, a two-objective Gur-game controller is used). In this example, there are two types of objectives: Euclidean distance and Curvature accuracy. The objective function is used to maximize the curvature accuracy while minimizing the Euclidean distance between the desired and actual shape. In operation, each player then rewards (r) itself with probability p(k) and penalizes itself with probability 1−p(k). Specifically, each player is a finite state machine (i.e., finite state automaton): they are allowed only one state at a given time and can transition to only an adjacent state at the next time. A player takes an action to move to positive numbered state (or vice versa). In negative numbered state, a player transitions to left if rewarded by the referee (as depicted in FIG. 4). In positive numbered state, a player transitions to the right if rewarded by the referee. To achieve multi-objectives, the objective functions are toggled between Euclidean distance and Curvature accuracy (as opposed to weighting the averages of Euclidean distance and Curvature accuracy). This is because two objective functions behave differently and cannot be mixed. In this embodiment, the objective functions are toggled every 30 rounds of control action.

Figure 5:
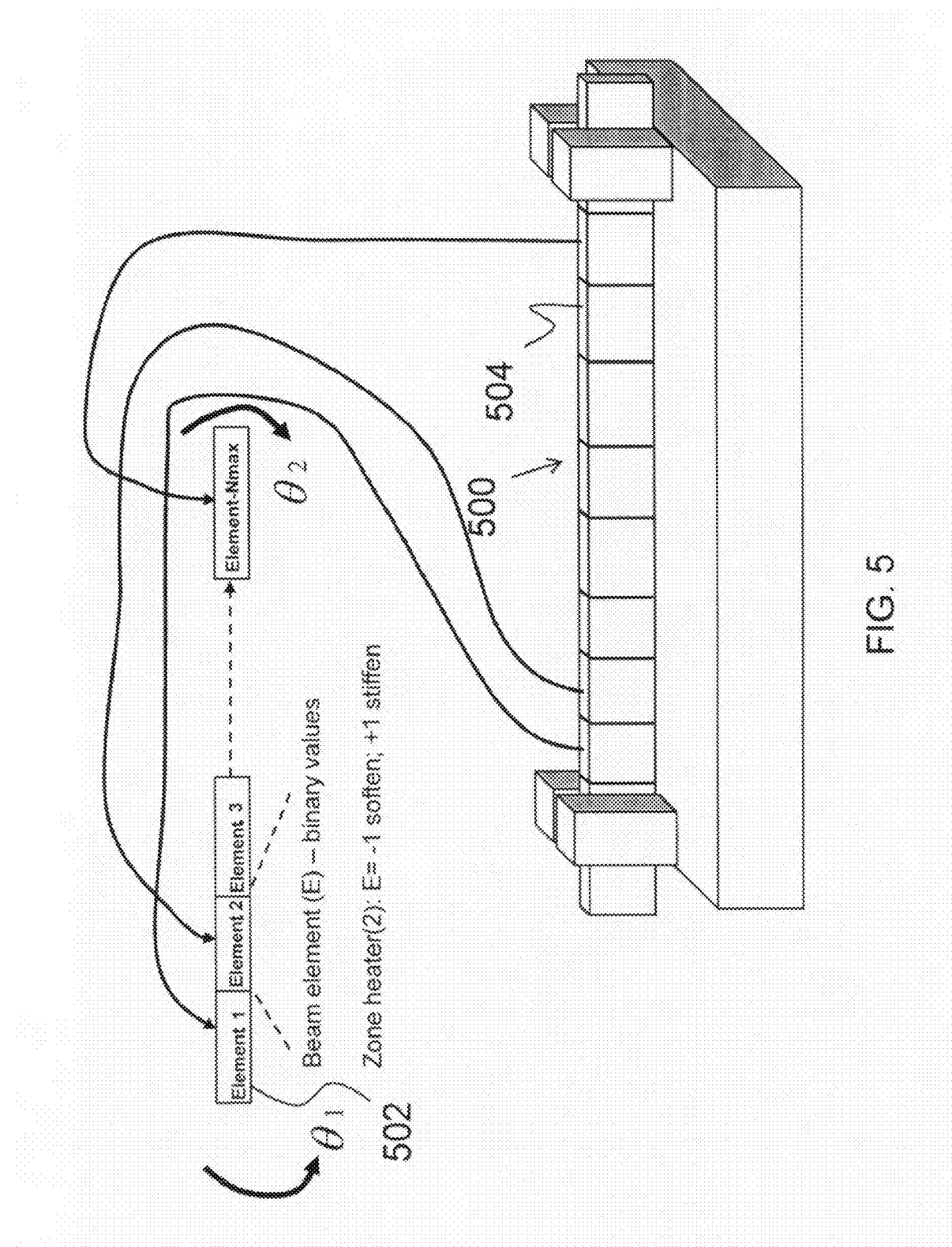
FIG. 5 is an illustration of design parameters of a beam being encoded using N zone heaters.

The Gur-game works efficiently because each player votes to achieve the best payoff possible for them self without attempting to predict other players behavior (unlike greedy solutions) to achieve maximum global utility. This baseline Gur-game was effective for controlling the N zone heaters in designing shape morphing strategies for reconfigurable 1-D beam. It was effective because zone heaters require only two control outputs from the players (i.e., −1: soften and +1: stiffen) (such a procedure is depicted in FIG. 5). In other words, in negative numbered state, the player will soften the corresponding beam element. In positive numbered state, a player stiffens its beam element.

FIG. 5 is an illustration of the design parameters of a beam 500 being encoded using a plurality of beam elements 502 with binary values. As shown, each beam element 502 corresponds to a variable stiffness element 504 in the beam 500. The zone heaters can be attached with each beam element 502 to control the stiffness settings of the corresponding variable stiffness element 504.

However, the baseline Gur-game was not effective for controlling the two actuators because the actuation is performed only at the ends via angle control (practically the only possibility). Thus, the Gur-game did not offer the additional degrees of freedom needed for fast convergence. Furthermore, the problem has more than one million possible states for an eight-element shape control task and the control task is path dependent. The limited availability of actuators also motivates the need for a variable stiffness approach.

To derive a solution to the highly nonlinear control problem and to address the large state space, a multi-level Gur-game was invented and embodied in the present invention. In this multi-level Gur-game, the players are organized to play in a hierarchical fashion wherein each player at the coarse (higher) level guides the actions of players in the next fine (lower) level until the desired level of performance is obtained at the lowest level. In this embodiment, an M-level (e.g., two-level) hybrid Gur-game controller is used to morph an eight element beam. The hybrid nature of the Gur-game arises from the fact that the player pool consist of both analog control outputs (angle control (i.e., angular rotation)) and digital control outputs (stiffness control). Its controller consists of three sets of Gur-games being played at the coarse level, with a separate player for each of the two angular actuator controls (angular rotation). For the stiffness control Gur-game (stiffness settings), the total number of players in the game is equal to the number of stiffness zones that needs to be controlled. So, for the eight element beam and two angle actuators, the total number of players will be ten (eight for stiffness and two for angle) at the coarse level. Each player can have a binary state for the stiffness control (e.g., +1 for stiff and −1 for soft). Similarly, the number of control outputs for a given actuator is based on the degree of quantization of angles that the actuator can control. The Gur-game includes a multi-arm structure to cover the possible analog states of each player. The multi-arm structure is a multi-arm state diagram that represents the finite state automaton (Gur-game). Each arm corresponds to a quantized portion of the angle to be controlled by the actuator. For example, in this embodiment, 32 levels of quantization can be used for the angles of each actuator. So, the player for each angle controller can traverse a total of 32 possible arms at the coarse level. The transition path between these arms is strictly restricted to its closest neighbor on either side. This ensures that there is no discontinuous changes in the angle control and thus ensures that the strain on the beam is limited.

Figure 6:
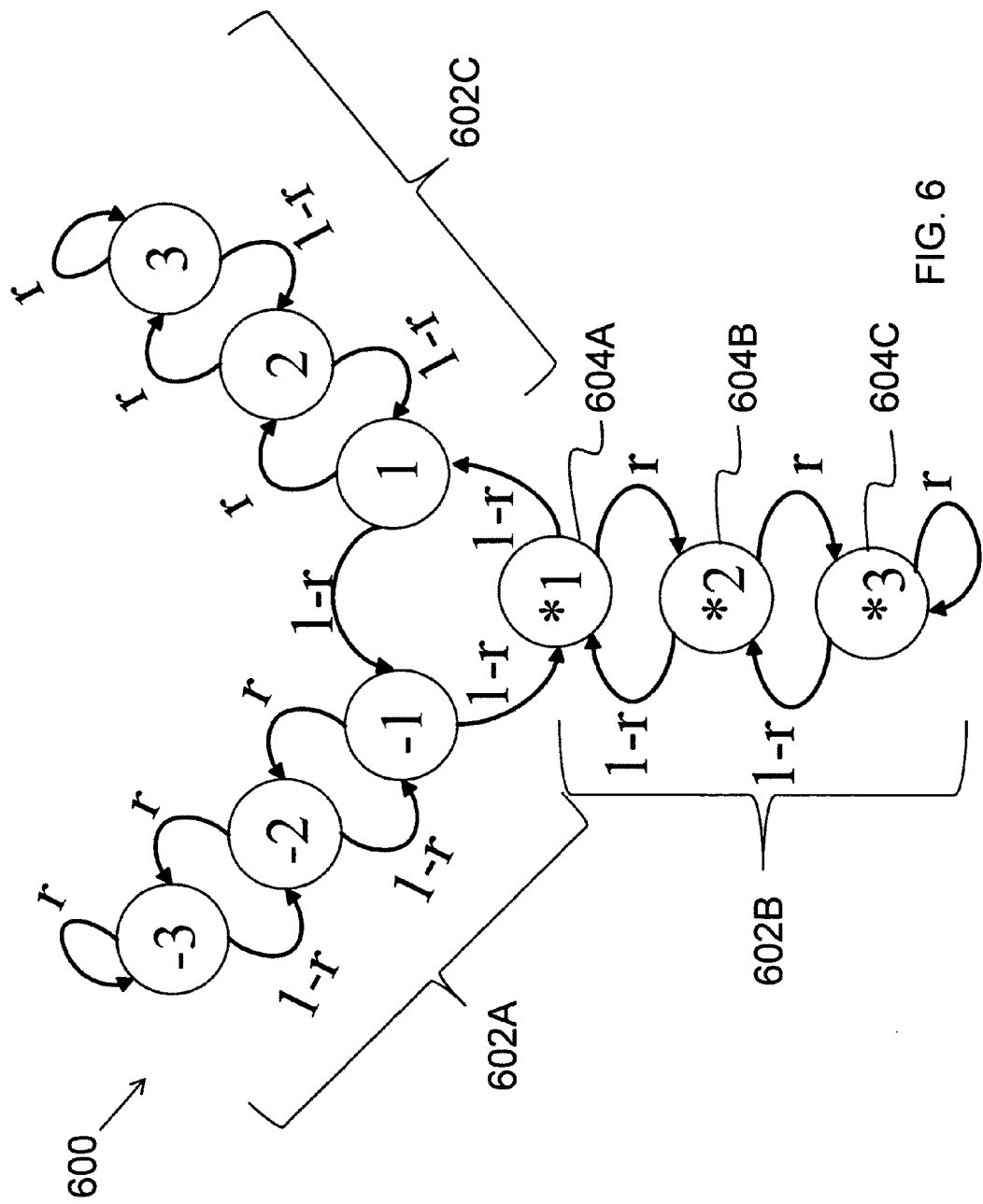
FIG. 6 is an illustration of a Gur-game automaton design using multi-arm states (M)

For illustration, FIG. 6 depicts a multi-arm automaton design 600 of M=3 quantized angular positions 602A, 602B, and 602C with a Gur-game memory of three states 604A, 604B, and 604C for each angular position. In this example, the Gur-game memory size is ten irrespective of the level at which the game is played.

Regarding stiffness settings, which happen at the finer scale, there are a total of N players (N bits with one player per bit) for each arm of the coarser level. Each player in the finer level can have two arms with an output of zero or one depending on whether the state is on the negative or positive side of the arm, respectively. Based on these features, in the Gur-game, the actuator's angle control is quantized into $M*2^N$ levels, where M=32 and N=6.

Figure 7:
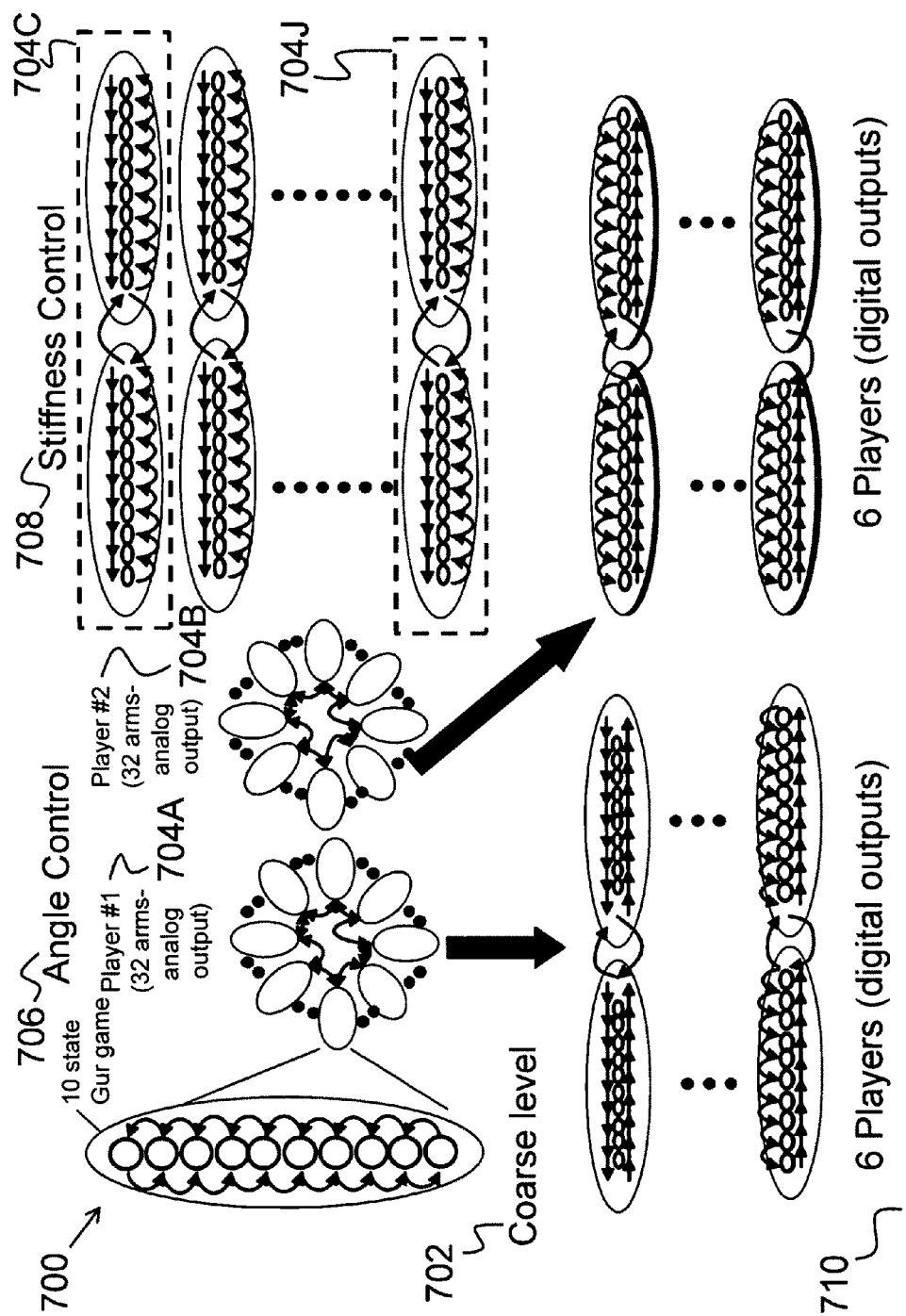
FIG. 7 is a schematic of the hybrid hierarchical Gur-game architecture for an 8 element beam with two angular controllers (one on either end of the beam)

For further illustration, FIG. 7 is a schematic of the hybrid (i.e., angular at analog and stiffness at digital) hierarchical Gur-game architecture 700 for an eight element beam with two angular controllers (one on either end of the beam). Thus, FIG. 7 illustrates the entire two-layered Gur-game structure implemented for the control of the beam. As can be appreciated by one skilled in the art, in other embodiments, the same general idea can be extended to several levels of resolution as needed for the particular application.

The coarse level 702 consists of ten players (two 704A and 704B for angle control 706 and eight 704C through 704J for stiffness control 708). Note that although there are eight players 704C through 704J for the stiffness control 708, for simplicity, FIG. 7 depicts only three of those eight players. The players of the angle control 706 have analog control outputs while the players for the stiffness control have digital control outputs (soft or stiff). The Gur-game at the fine level 710 is played only for the selected arms (shown as bold ellipses) of the angle control players and the eight players for stiffness from the coarse level. There a total of six players for each arm.

Thus, at a given time at the fine level 710, there are a total of twenty players (twelve for angle and eight for stiffness).

Figure 8:
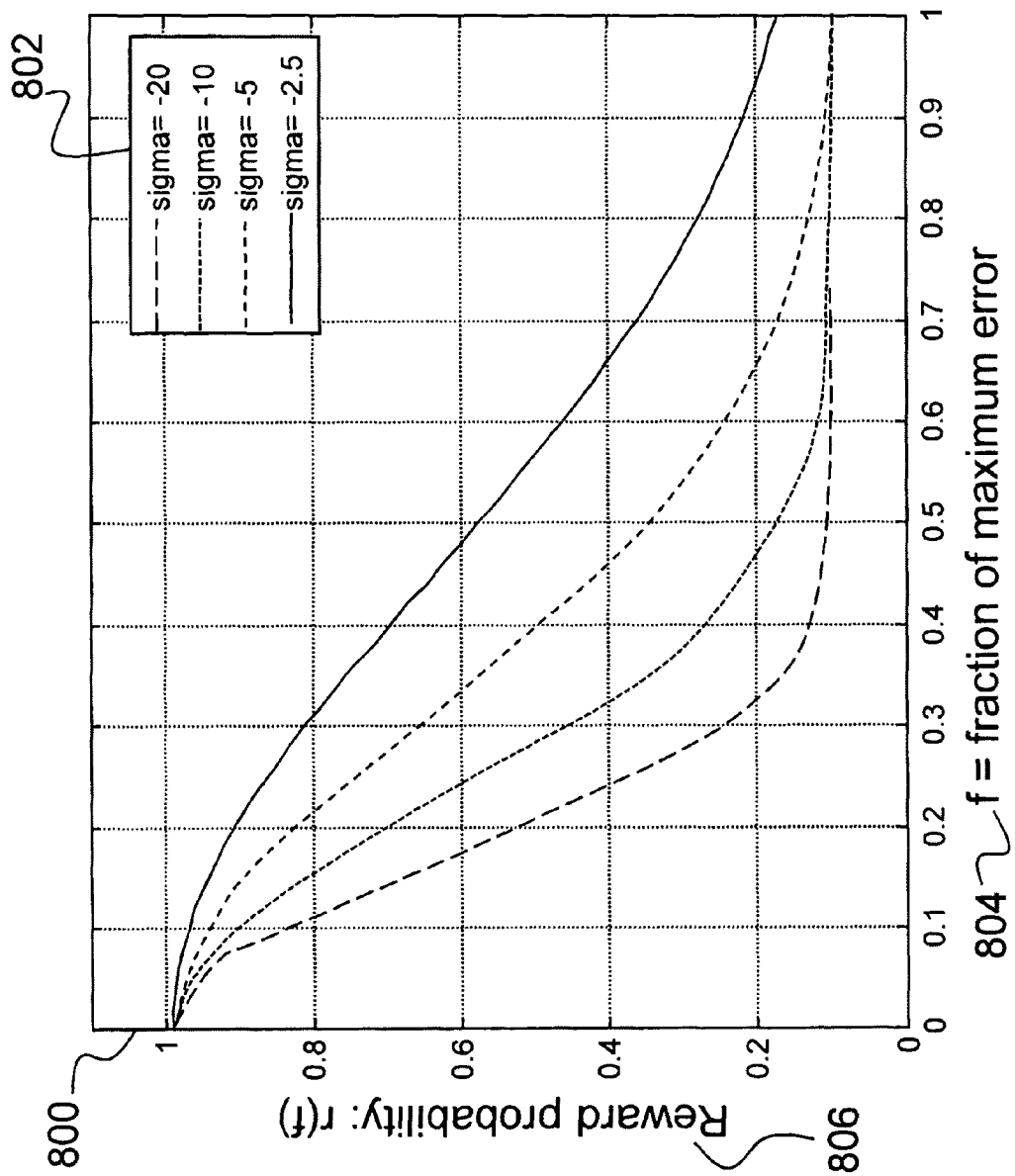
FIG. 8 is a chart illustrating a reward function for various values of sigma based on the level of accuracy between the actual and desired shapes of the beam.

The system is capable of multi-objective optimization. In one aspect, the problem of multi-objective optimization is not set up as a problem of selecting the appropriate weighting for the various features requiring optimization. Instead, the esystem weighs the duration for which each of the features to be optimized is performed in a fully independent manner. Weighing the duration redirects the focus of the optimization from searching for appropriate scales for each feature into one of searching for appropriate durations to apply each feature. Another typical issue with traditional Gur-game controllers is that it can become stuck in local minima. Being stuck in the local minima can cause the controller to completely stop morphing the beam. To avoid this problem, all the states of the players are reset when they reach or approach a local minima. In other words, the players are brought back to the center of the finite state automata and begin playing the game again. Such a resetting mechanism allows the system to get out of local minima issues. In addition, a varying reward function is included that decreases the sharpness of the reward function as the control error begins to fall. Decreasing the sharpness as the control error begins to fall is akin to annealing the reward function, which is a new concept in Gur-game theory. For example and as depicted in FIG. 8, this means that the reward function becomes very broad as the game proceeds and the desired goal is close to being achieved. More specifically, FIG. 8 illustrates a chart 800 that plots the reward functions for various values of sigma 802 that are derived based on the level of accuracy between the actual and desired shapes of the beam. As the maximum error 804 reduces, the reward function 806 is gradually broadened (akin to simulated annealing), which is desirable because the states of players near the goal is more desirable and hence should be rewarded with less dependence on the function $f$. These two features allow the controller to behave in a smooth fashion and achieve rapid convergence.

Figure 9:
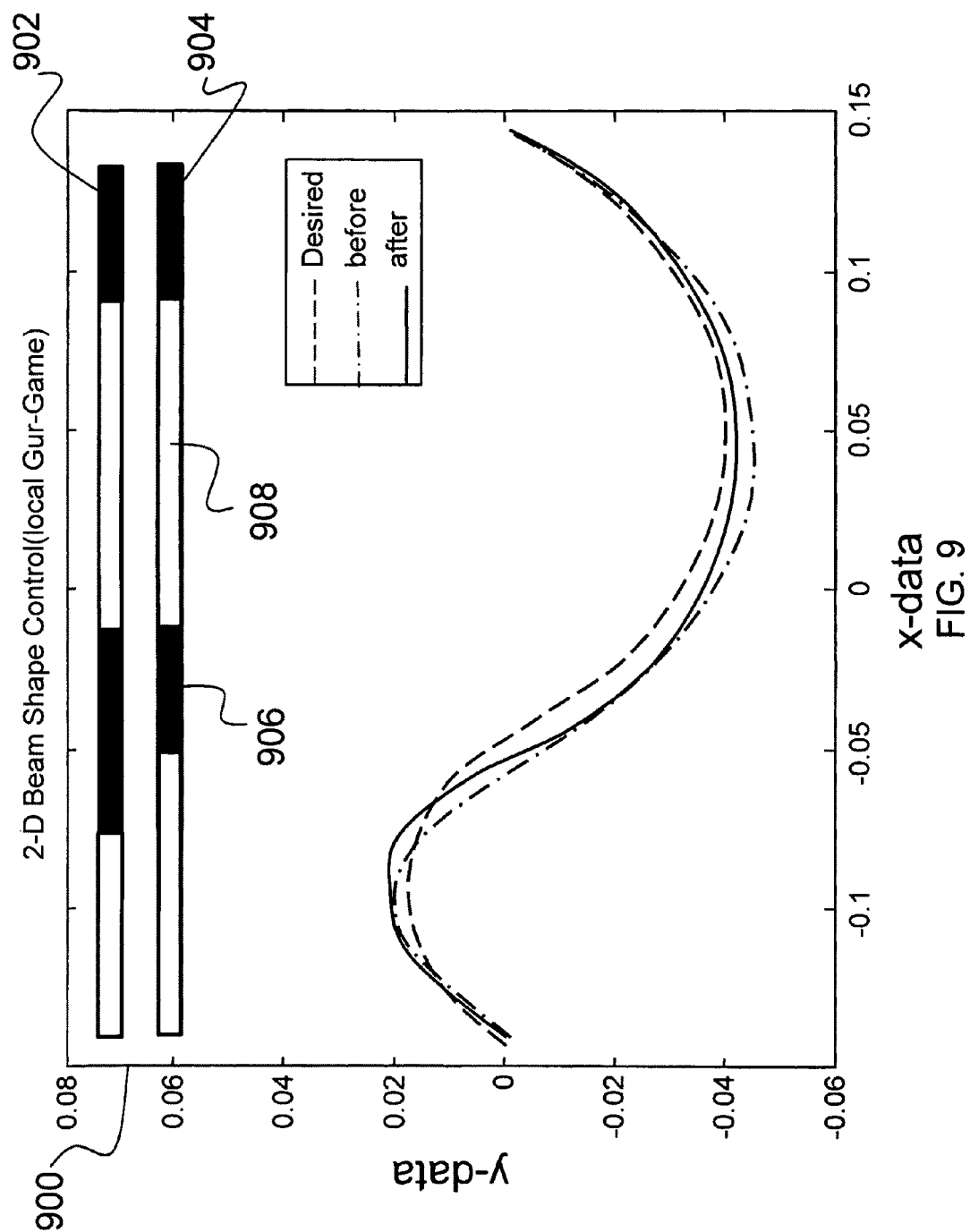
FIG. 9 is a plot of the stiffness profile (on top) and the actual shapes of the beams during a local control step.

During the actual control task, the control is toggled between coarse top level and fine lower level. When the coarse top level is chosen, the corresponding fine level is fixed. Similarly, when the fine lower level is chosen, the corresponding coarse top level is fixed. In this embodiment, the strategy is toggled every three rounds of control action. When the strategy is stuck in a sub-optimum state for several rounds, all the automata are reset and a more narrowed reward function is adopted. For rapid convergence, when the error is below a certain threshold, the coarse strategy is eliminated, with only a small variation of angle control for the actuators allowed. In addition, in this situation, the strategy can be toggled between local versus global control strategy. At the global level, all beam elements are manipulated based on the outputs from the Gur-game players. At the local level, only the beam element with the worst Euclidean distance or curvature accuracy is allowed to switch its stiffness state (as shown in FIG. 9). This feature allows the system to realize fine control as well. FIG. 9 illustrates a plot chart 900 of the stiffness profile and the actual shapes of the beams during a local control step. The first beam 902 illustrates the beam configuration before the control action, while the second beam 904 illustrates the beam configuration after the control action. Additionally, the dark portions 906 of the beam depict stiff elements while the light portions 908 of the beam depict soft elements.

At the local level, only the beam element with the worst Euclidean distance (e.g., element 3) is allowed to switch its state from soft to stiff, which further minimizes the error between the desired shape and actual shape produced due to the control actions of the Gur-game controller.

Figure 10:
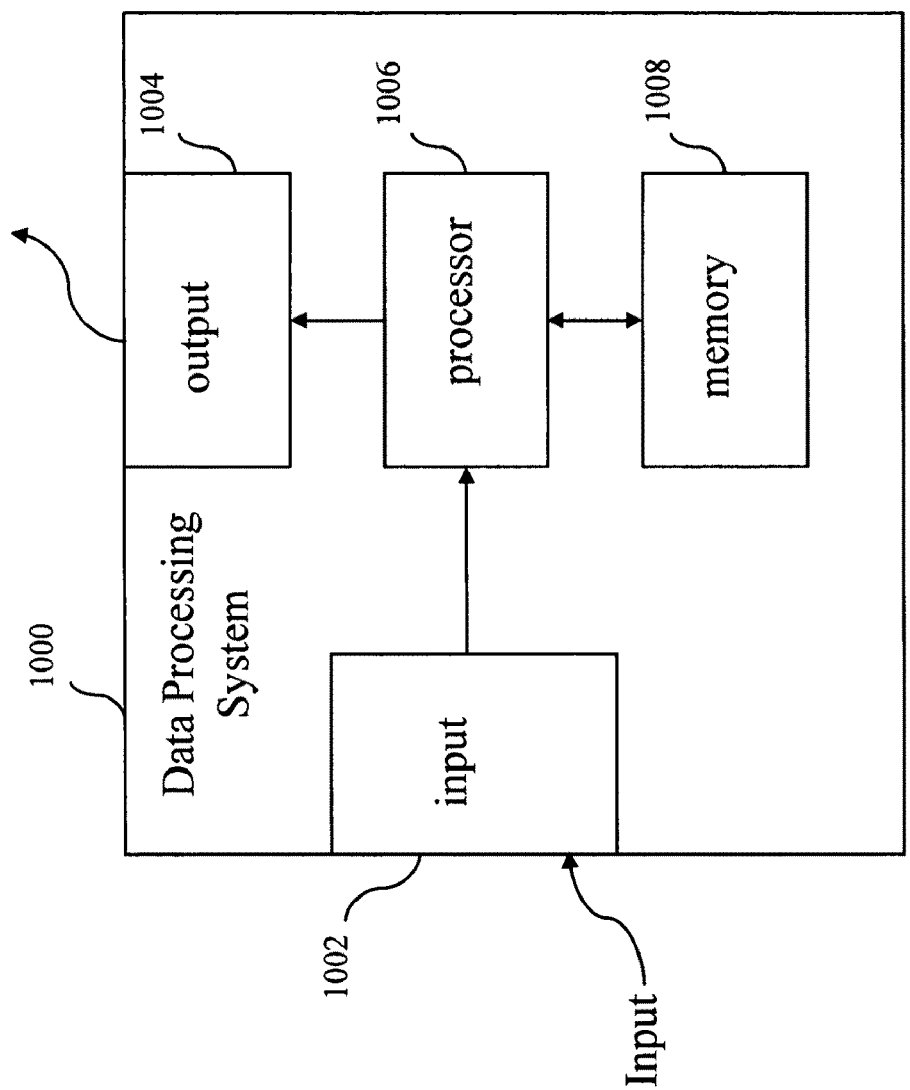
FIG. 10 is a block diagram depicting the components of a system of the present invention.

The present invention can be incorporated into a computer system having one or more processors. A block diagram depicting the components of a hierarchical system of the present invention is provided in FIG. 10. The system 1000 comprises an input 1002 for receiving commands from a user and/or information from at least one sensor regarding the stiffness/position, etc. of the beams. Note that the input 1202 may include multiple "ports." Typically, input is received from at least one sensor and/or a user interface. An output 1004 is connected with the processor for the shape control to the variable stiffness structures and/or information related to the control of the structures. Output may also be provided to other devices or other programs; e.g., to other software modules, for use therein. The input 1002 and the output 1004 are both coupled with a processor 1006, which may be a general-purpose computer processor or a specialized processor designed specifically for use with the present invention. The processor 1006 is coupled with a memory 1008 to permit storage of data and software that are to be manipulated by commands to the processor 1006.

Figure 11:
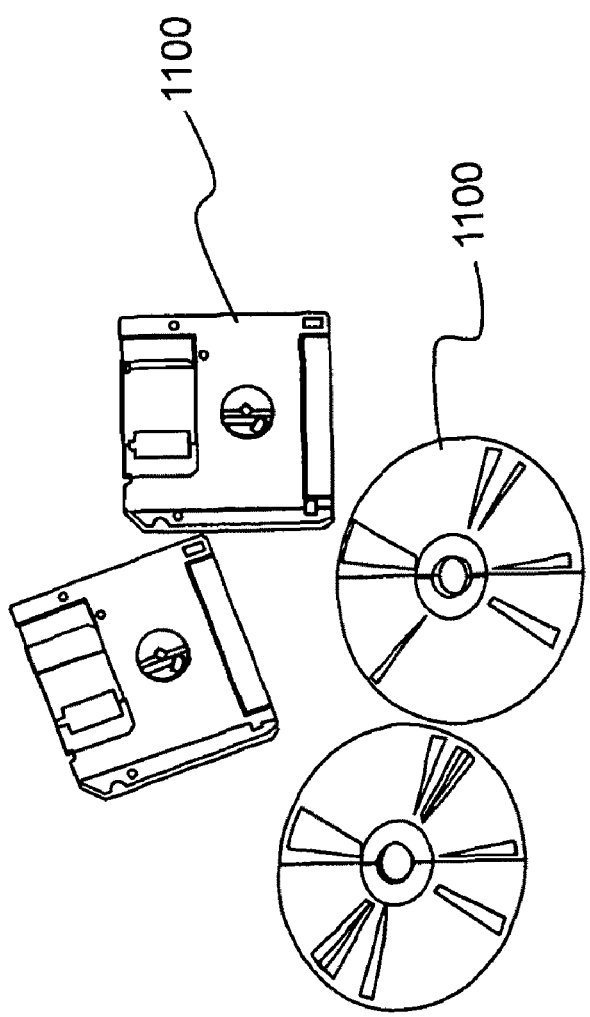
FIG. 11 is an illustrative diagram of a computer program product embodying the present invention.

An illustrative diagram of a computer program product embodying the present invention is depicted in FIG. 11. The computer program product 1100 is depicted as an optical disk such as a CD or DVD. However, as mentioned previously, the computer program product generally represents computer-readable instructions stored on any compatible computer-readable medium.

What is claimed is:

1. A method for multi-objective shape control of a variable stiffness structure, comprising acts of:
   initializing a hierarchical hybrid Gur-game controller connected with a variable stiffness structure, where the hierarchical hybrid Gur-game controller includes a hierarchy of Gur-games being utilized, such that at each level of the hierarchy the Gur-game controller is configured to control a set of actuation and stiffness change control actions of the variable stiffness structure;
   utilizing the Gur-game controller to optimize an objective function that is computed by actions of a plurality of players to morph the variable stiffness structure into a desired shape, where each player is a variable that can be optimized using the Gur-game; and
   morphing the variable stiffness structure into the desired shape according to the optimized variables.

2. A method as set forth in claim 1, wherein in initializing a hierarchical hybrid Gur-game controller, the actuation and stiffness change control actions include at least two angular rotations and at least one stiffness setting of the variable stiffness structure, with the angular rotations and stiffness setting being variables that can be optimized.

3. A method as set form in claim 2, further comprising an act of configuring the Gur-game controller to include a Gur-game with a multi-arm structure to model players with analog control outputs.

4. A method as set forth in claim 3, further comprising an act of configuring the Gur-game controller to include a Gur-game that comprises a pool of players of both binary and analog control outputs.

5. A method as set forth in claim 4, further comprising an act of configuring the Gur-game controller to operate as a time-based multi-objective optimizer such that duration is weighted for each variable to search for an optimized duration to apply each variable.

6. A method as set forth in claim 5, further comprising an act of configuring the Gur-game controller to prevent the Gur-game from being stuck in a local minima by causing each player to reset and restart the Gur-game when a player reaches a local minima.

7. A method as set forth in claim 6, wherein the Gur-game controller includes control error and further comprising an act of configuring the Gur-game controller to include a reward function that decreases as the control error decreases.

8. A method as set forth in claim 1, further comprising an act of toggling the objective function between Euclidean distance and curvature accuracy.

9. A method as set forth in claim 1, further comprising an act of configuring the Gur-game controller to include a Gur-game that comprises a pool of players of both binary and analog control outputs.

10. A method as set forth in claim 1, further comprising an act of configuring the Gur-game controller to operate as a time-based multi-objective optimizer such that duration is weighted for each variable to search for an optimized duration to apply each variable.

11. A method as set forth in claim 1, further comprising an act of configuring the Gur-game controller to prevent the Gur-game from being stuck in a local minima by causing each player to reset and restart the Gur-game when a player reaches a local minima.

12. A method as set forth in claim 1, wherein the Gur-game controller includes control error and further comprising an act of configuring the Gur-game controller to include a reward function that decreases as the control error decreases.

13. A computer program product for multi-objective shape control of a variable stiffness structure, the computer program product comprising computer-readable instruction means stored on a computer-readable medium that are executable by a computer for causing the computer to perform operations of:
   initializing a hierarchical hybrid Gur-game controller connected with a variable stiffness structure, where the hierarchical hybrid Gur-game controller includes a hierarchy of Gur-games being utilized, such that at each level of the hierarchy the Gur-game controller is configured to control a set of actuation and stiffness change control actions of the variable stiffness structure;
   utilizing the Gur-game controller to optimize an objective function that is computed by actions of a plurality of players to morph the variable stiffness structure into a desired shape, where each player is a variable that can be optimized using the Gur-game; and
   morphing the variable stiffness structure into the desired shape according to the optimized variables.

14. A computer program product as set forth claim 13, wherein in initializing a hierarchical hybrid Gur-game controller, the actuation and stiffness change control actions include at least two angular rotations and at least one stiffness setting of the variable stiffness structure, with the angular rotations and stiffness setting being variables that can be optimized.

15. A computer program product as set forth in claim 14, further comprising instructions means for configuring the Gur-game controller to include a Gur-game with a multi-arm structure to model players with analog control outputs.

16. A computer program product as set forth in claim 15, further comprising instructions means for configuring the Gur-game controller to include a Gur-game that comprises a pool of players of both binary and analog control outputs.

17. A computer program product as set forth in claim 16, further comprising instructions means for operating the Gur-game controller as a time-based multi-objective optimizer such that duration is weighted for each variable to search for an optimized duration to apply each variable.

18. A computer program product as set forth in claim 17, further comprising instructions means for preventing the Gur-game from being stuck in a local minima by causing each player to reset and restart the Gur-game when a player reaches a local minima.

19. A computer program product as set forth in claim 18, further comprising instructions means for configuring the Gur-game controller to include control error and a reward function that decreases as the control error decreases.

20. A computer program product as set forth in claim 13, further comprising instructions means for causing the Our-game controller to toggle the objective function between Euclidean distance and curvature accuracy.

21. A computer program product as set forth in claim 13, further comprising instructions means for configuring the Gur-game controller to include a Gur-game that comprises a pool of players of both binary and analog control outputs.

22. A computer program product as set forth in claim 13, further comprising instructions means for operating the Gur-game controller as a time-based multi-objective optimizer such that duration is weighted for each variable to search for an optimized duration to apply each variable.

23. A computer program product as set forth in claim 13, further comprising instructions means for preventing the Gur-game from being stuck in a local minima by causing each player to reset and restart the Gur-game when a player reaches a local minima.

24. A computer program product as set forth in claim 13, further comprising instructions means for configuring the Gur-game controller to include control error and a reward function that decreases as the control error decreases.

25. A system for multi-objective shape control of a variable stiffness structure, the system comprising one or more processors configured to perform operations of:
   initializing a hierarchical hybrid Gur-game controller connected with a variable stiffness structure, where the hierarchical hybrid Gur-game controller includes a hierarchy of Gur-games being utilized, such that at each level of the hierarchy the Gur-game controller is configured to control a set of actuation and stiffness change control actions of the variable stiffness structure;
   utilizing the Gur-game controller to optimize an objective function that is computed by actions of a plurality of players to morph the variable stiffness structure into a desired shape, where each player is a variable that can be optimized using the Gur-game; and
   morphing the variable stiffness structure into the desired shape according to the optimized variables.

26. A system as set forth in claim 25, wherein in initializing a hierarchical hybrid Gur-game controller, the actuation and stiffness change control actions include at least two angular rotations and at least one stiffness setting of the variable stiffness structure, with the angular rotations and stiffness setting being variables that can be optimized.

27. A system as set forth in claim 26, the system being further configured to perform an operation of configuring the Gur-game controller to include a Gur-game with a multi-arm structure to model players with analog control outputs.

28. A system as set forth in claim 27, the system being further configured to perform an operation of configuring the Gur-game controller to include a Gur-game that comprises a pool of players of both binary and analog control outputs.

29. A system as set forth in claim 28, the system being further configured to operate the Gur-game controller as a time-based multi-objective optimizer such that duration is weighted for each variable to search for an optimized duration to apply each variable.

30. A system as set forth in claim 29, the system being further configured to prevent the Gur-game from being stuck in a local minima by causing each player to reset and restart the Gur-game when a player reaches a local minima.

31. A system as set forth in claim 30, the system being further configured to configure the Gur-game controller to include control error and a reward function that decreases as the control error decreases.

32. A system as set forth in claim 25, the system being further configured to perform an operation of toggling the objective function between Euclidean distance and curvature accuracy.

33. A system as set forth in claim 25, the system being further configured to perform an operation of configuring the Gur-game controller to include a Gur-game that comprises a pool of players of both binary and analog control outputs.

34. A system as set forth in claim 25, the system being further configured to operate the Gur-game controller as a time-based multi-objective optimizer such that duration is weighted for each variable to search for an optimized duration to apply each variable.

35. A system as set forth in claim 25, the system being further configured to prevent the Gur-game from being stuck in a local minima by causing each player to reset and restart the Gur-game when a player reaches a local minima.

36. A system as set forth in claim 25, the system being further configured to configure the Gur-game controller to include control error and a reward function that decreases as the control error decreases.

\* \* \* \* \*